United States Patent [19]

Curtice

[11] 4,160,919
[45] Jul. 10, 1979

[54] EXCLUSIVE-OR CIRCUIT

[75] Inventor: Walter R. Curtice, West Windsor, N.J.

[73] Assignee: RCA Corporation, New York, N.Y.

[21] Appl. No.: 877,482

[22] Filed: Feb. 13, 1978

[51] Int. Cl.$^2$ ...................... H03K 19/32; H03K 19/08
[52] U.S. Cl. .................................... 307/216; 307/206; 307/299 R; 357/3
[58] Field of Search ................... 307/216, 299 R, 206, 307/302, 304; 357/3; 328/93

[56] References Cited
U.S. PATENT DOCUMENTS

4,047,199  9/1977  Kataoka et al. ........................ 357/3

Primary Examiner—John Zazworsky
Attorney, Agent, or Firm—H. Christoffersen; Joseph D. Lazar; Raymond E. Smiley

[57] ABSTRACT

Two input signals, each being at either of two different amplitudes, are coupled to respective Schottky-barrier gates of one transferred electron logic device (TELD) of relatively low transit-time frequency and coupled via a delay means to respective Schottky-barrier gates of another TELD of relatively high transit-time frequency. When the two input signals are at different amplitudes, the TELD connected via the delay means becomes biased to domain formation, thereby causing an output signal having a first value to be produced. When both input signals are at one of the amplitudes, the other TELD becomes biased to domain formation, thereby causing an output signal having a second value to be produced. When both input signals are of the other of the amplitudes, neither TELD is biased to domain formation, thereby causing an output signal having a third value to be produced.

4 Claims, 8 Drawing Figures

Fig. 2.

TABLE 1

| ENTRY | X | Y | S |
|---|---|---|---|
| 1 | 0 | 0 | 0 |
| 2 | 1 | 0 | 1 |
| 3 | 0 | 1 | 1 |
| 4 | 1 | 1 | 0 * |

Fig. 3.

TABLE 2

| | $T_1$ | $T_2$ | $T_3$ | $\tau$ | $T_{10}$ | $T_{12}$ | X,Y TOL. | INPUT TO OUTPUT DELAY |
|---|---|---|---|---|---|---|---|---|
| CASE No.1 | $T_1 \ll T_{IN}$ | $T_1$ | $T_1$ | $T_1$ | $T_{IN}-T_1$ | $T_{IN}$ | $T_1/2$ | $2T_1$ |
| CASE No.2 | $T_1 \ll T_{IN}$ | $T_1$ | $T_1$ | $2T_1$ | $T_{IN}-T_1$ | $T_{IN}+T_1$ | $T_1/2$ | $3T_1$ |

TABLE 3

| X | Y | $C_o$ |
|---|---|---|
| 0 | 0 | 0 |
| 0 | 1 | 0 |
| 1 | 0 | 0 |
| 1 | 1 | 1 |

EXCLUSIVE-OR CIRCUIT

The Government has rights in this invention pursuant to Contract No. N00014-76-C-0465 awarded by the Department of the Navy.

BACKGROUND OF THE INVENTION

Logic circuits capable of gigabit per second operating rates are, for example, especially suitable in a computer that provides a real time computation of a Fourier transform and a fast multiplication of operands.

The computer typically has an arithmetic unit that includes a plurality of full adder circuits, each comprised of a group of two series coupled exclusive-OR gates. When signals are applied to inputs of a logic gate, a modulo 2 sum signal is provided at the output thereof after a time known as a gate delay. The gate delays of the group of gates determines the maximum operating rate of the arithmetic unit.

Prior art gates often include silicon bipolar "emitter-coupled logic" (ECL) devices that operate at many hundreds of megahertz. A circuit of LSI ECL gates, for example, typically exhibits a gate time delay of 0.5 nanoseconds. However, an experimental non-threshold logic circuit of ECL gates exhibited a 100 picosecond gate delay (T. Sakai, Y. Sunohara, N. Nakamura, and T. Sudo, "A 100 PS Bipolar Logic," Digest Tech. Papers, 1977, ISSCC, pp. 196-197).

Recently, gallium arsenide (GaAs) material has been used to make MESFET circuits that perform frequency division at four gigahertz. This was reported by R. Van Tuyl, C. Liechti, and C. Stolte in "Gallium Arsenide Digital Integrated Circuits," Tech. Report AFAL-TR-76-264, Air Force Systems Command, Wright-Patterson AFB, Ohio, April 1977. Alternatively, gigabit per second gates are made by using a GaAs transferred electron logic device (TELD). TELDs are more commonly known as Schottky-barrier-gate Gunn-effect digital devices.

The TELD may be used to construct simpler, faster gates for performing logic functions with few TELDs per logic function. Although the MESFET devices may be used to construct a gate, many MESFET devices are needed to build a gate that may be constructed with few TELDs.

A bias voltage is usually applied between the anode and the cathode of the TELD and a second bias voltage is applied between the gate and cathode, thereby causing a current to flow therethrough. The anode bias voltage is typically set to about 90% of a threshold voltage. When the anode to cathode voltage equals or exceeds the threshold voltage, a mobile "dipole" domain is created in the TELD. The dipole domain comprises an electron charge depletion region, preceding an electron charge accumulation region, that drifts from a gate terminal of the TELD to the anode during a portion of the transit time period. The transit time period is the total time for domain formation, drift to the anode and collection at the anode. The dipole domain causes a decrease in the TELD current during the domain formation time and continued lower current during drift portion of the transit time. During the collection time, the current increases. When the anode to cathode voltage is maintained in excess of the threshold voltage, domains are serially formed resulting in the above described current flow.

The reciprocal of the transit time period is the transit time frequency. In TELD devices utilized in resistive circuits, the transit time frequency depends strongly on the domain transit time which is proportional to domain velocity and inversely proportional to anode-to-gate (if a gate is not present, anode-to-cathode) separation. Thus, the transit time period of a set of TELDs made from GaAs material of similar properties can be tailored as desired by choice of the values of anode-to-gate separation.

It should be understood that the TELD has a negative resistance characteristic when the domain is formed. Accordingly, when a resistive load is in series with the TELD, a decrease in the current occurs concurrently with an increase in the anode to cathode voltage.

The anode-to-cathode threshold voltage is determined by the gate bias voltage with respect to the cathode, the TELD geometry and material constants. As the gate-to-cathode voltage increases the anode-to-cathode threshold voltage increases.

A split gate TELD has first and second gates substantially equi-distant from the anode. When the split gate TELD operates at a given anode-to-cathode bias voltage, as each gate to cathode voltage increases, the anode-to-cathode threshold voltage increases. When, for example, the first and second gates have a relatively positive bias voltage, a relatively high threshold voltage is established. When the first gate has a relatively positive bias voltage and the second gate has a relatively negative bias voltage, an intermediate threshold voltage is established. When the first and second gates have the relatively negative bias voltage, a relatively low threshold voltage is established. Because of the threshold voltage, the split gate TELD may be used to construct one type of circuit that performs a logical OR function and another type of circuit that performs a logical AND function. The design of logical OR and AND TELD circuits is described by S. Kataoka, N. Hashiyume, M. Kawashima, and Y. Komamiya in an article entitled "High Field Domain Function Logic Devices with Multiple Control Electrodes," Proc. 4th Bienn. Cornell Elec. Eng. Conf. vol. 4, pp. 225-234, 1973.

SUMMARY OF THE INVENTION

According to the present invention, in an exclusive-OR circuit a pair of input terminals are respectively connected to gates of a first split gate transferred electron logic device (TELD) of relatively high transit time frequency through time delay means whereby an input signal provided at an input terminal is applied to a gate of said first device after a delay time. The anode of said first device is adapted to receive a positive voltage thereat while the cathode is connected to the anode of a second transferred electron logic device of relatively low transit time frequency. The cathode of said second device is adapted to receive a negative voltage thereat. The gates of said second device are respectively coupled to the input terminals to cause a fraction of an input signal to be applied to a gate of the second device. In response to a logic 0 input signal provided to both terminals, no domains are formed in the devices and a logic 0 signal is provided at the junction. In response to a logic 1 signal being provided at either of the terminals, a domain is formed in the first device to cause a logic 1 signal to be provided at the junction. In response to logic 1 being simultaneously applied to both of the terminals, a domain forms in the second device and causes a signal to be provided at the junction which is interpreted as a logic 0 by subsequent TELD gates.

BRIEF DESCRIPTION OF THE DRAWING

FIG. 1 is a schematic diagram of the preferred embodiment of an exclusive-OR circuit in accordance with the present invention;

FIG. 7 is a schematic diagram of a half adder circuit that includes an exclusive-OR circuit of FIG. 1.

DETAILED DESCRIPTION OF THE PREFERRED EMBODIMENT

Referring to FIG. 1, an exclusive-OR gate circuit 8 includes first split gate TELD 10 of transit time period $T_{10}$, having its cathode (C) connected to the anode (A) of a second split gate TELD 12 of transit time period $T_{12}$ where $T_{12}$ is preferably equal to $T_{10}+T_1$, where $T_1$=the input to output time delay of TELD 10 and to an output terminal S. TELDs 10 and 12 have substantially identical parameters except for the abovementioned transit time relationship.

The anode (A) of TELD 10 is connected to a source of potential, $V_1$. The cathode (C) of TELD 12 is coupled through resistor 22 to ground. Accordingly, TELDs 10 and 12 and resistor 22 are all in series. The value of the potential, $V_1$, causes the anode-to-cathode voltages of TELDs 10 and 12 to be about 90% of the threshold voltages of the TELDs.

When the anode to cathode voltage of a TELD is well below the threshold voltage thereof, there is what is known as a low field resistance between the anode and the cathode of the TELD. In this embodiment, the resistance of resistor 22 substantially equals the low field resistance of TELDs 10 and 12.

Bias voltages at a gate $G_1$ of TELD 10 and a gate $G_1$ of TELD 12, are established by a first voltage divider comprised of resistors 24, 26, and 28 connected in series between a source of a potential, $V_2$, and ground. The junction of resistors 26 and 28 is connected to gate $G_1$ of TELD 12. The junction of resistors 24 and 26 is connected to an input terminal X and to gate $G_1$ of TELD 10 through a delay line 30 or any other suitable time delay means providing a delay time, $\tau$, substantially equal to the domain formation time of TELD 12 and therefore TELD 10. The value of resistors 24, 26, and 28 are preferably chosen to cause the voltage at the gates $G_1$ of TELDs 10 and 12 to approximate the bias voltages at the cathodes (C) of TELD 10 and TELD 12, respectively. It should be understood that the bias voltage of gate $G_1$ of TELD 10 is more positive than the bias voltage of gate $G_1$ of TELD 12.

Terminal XX is connected to the junction of delay line 30 and gate $G_1$ of TELD 10. Terminal YY is connected to the junction of delay line 40 and gate $G_2$ of TELD 10.

An input voltage applied to terminal X is provided to gate $G_1$ of TELD 10 after a time delay introduced by delay line 30. The time delay, $\tau$, is equal to or greater than the time required for formation of a domain at a gate of TELD 12 but less than the transit time of the domain. It should be understood that highest speed operation is achieved when the delay in delay line 30 is no greater than the time for domain formation in TELD 12.

Bias voltages at a gate $G_2$ of TELD 10 and a gate $G_2$ of TELD 12 are established by a second voltage divider comprised of resistors 34, 36, and 38 that are connected in series between the source, $V_2$, and ground. Resistors 34, 36, and 38 have resistances substantially the same as resistors 24, 26, and 28, respectively.

A junction of resistors 36 and 38 is connected to gate $G_2$ of TELD 12. A junction of resistors 34 and 36 is connected to an input terminal Y and to gate $G_2$ of TELD 10 through a delay line 40 similar to delay line 30 described hereinbefore and having substantially the same time delay, $\tau$. Since resistors 34, 36, and 38 have resistances substantially the same as resistors 24, 26, and 28, the bias voltages at gates $G_1$ and $G_2$ of TELD 10 are substantially equal. Additionally, the bias voltages at gates $G_1$ and $G_2$ of TELD 12 are substantially equal. Moreover, when an input voltage is applied to terminal Y, it is provided to gate $G_2$ of TELD 10 after a time delay introduced by delay line 40.

The threshold voltage of TELD 10 is exceeded when a logic 1 input voltage is applied to either of terminals X or Y, thereby causing a domain to be formed in TELD 10. It should be understood that the logic 1 is more negative than the D.C. bias voltage of gates $G_1$ and $G_2$ and cathode C of TELD 10. Logic 0 voltage is substantially equal to the D.C. bias voltage of gates $G_1$ and $G_2$ and cathode C of TELD 10.

When the logic 1 is applied to terminal X, for example, the first voltage divider causes a logic 1 voltage of reduced amplitude to be applied to gate $G_1$ of TELD 12. Similarly, when the logic 1 is applied to terminal Y, the second voltage divider causes a voltage of reduced amplitude to be applied to gate $G_2$ of TELD 12.

Voltage of reduced amplitude applied to either gate $G_1$ or $G_2$ of TELD 12, does not cause a domain formation therein. However, when the logic 1 signal is concurrently applied to terminals X and Y, the voltage of reduced amplitude is concurrently applied to gates $G_1$ and $G_2$ of TELD 12; the concurrent application causes a domain formation in TELD 12.

Figure 2:
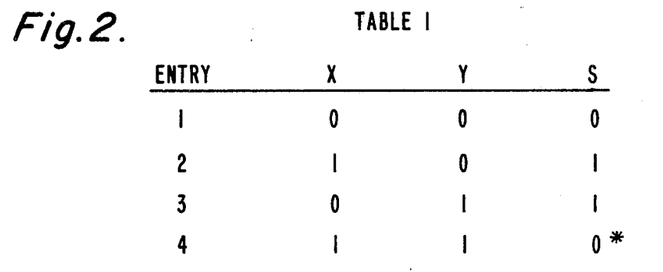
FIG. 2 is a table of input and output logic values associated with the circuit of FIG. 1.

As explained hereinafter, because of the time of domain formation in TELDs 10 and 12, exclusive-OR circuit 8 operates in accordance with truth table 1, FIG. 2.

In table 1:

X, Y, and S are terminals shown in FIG. 1;

1 represents the circuit logic 1 voltage;

0 represents a logic 0 voltage having a first value; and

0* represents a logic 0 voltage having a second value but which is treated as a logic 0 by subsequent circuits of the type which are compatible with the exclusive-OR circuit being described.

The logic voltage value or "bit" value exists for a period of time known in the art as the "bit duration."

It should be appreciated that these logic quantities are dynamic and not static voltages because TELD gates are used here as astable circuits. For example, a series of input logic 1 values substantially of TELD 10 transit-time period must be interleaved with logic 0 values (of short duration relative to the transit time period) for proper operation of the circuit under all combinations of input conditions. The origin of such input signals for this circuit is usually a second TELD circuit. In addition, a logic state output (logic 0, logic 0* or logic 1)

exists for the time a domain is in transit. The minimum period between input logic states is substantially equal to the transit time period. This causes the astable operation in TELD devices.

Operation of the circuit of FIG. 1 will now be given with reference to FIG. 2, Table 1. In accordance with entry 1 thereof, when, for example, logic 0 is applied to both terminals X and Y, the voltages of gates $G_1$ and $G_2$ of TELDS 10 and 12 are such that no domain formation occurs in either TELD. The voltage at TELD 10, terminal S, therefore, corresponds to the logic 0 in accordance with the first entry of Table 1.

In accordance with entry 2 of table 1, the logic 1 applied to terminal X concurrently with the logic 0 applied to terminal Y is not of sufficient negative amplitude to cause a domain formation in TELD 12. After delay, $\tau$, following application of logic 1 to terminal X, the logic 1 is applied to gate 1 of TELD 10, causing domain formation to occur in TELD 10. The negative resistance characteristic of TELD 10 causes an increase in the voltage from the anode (A) to the cathode (C) of TELD 10 and a decrease in the voltage at terminal S relative to the condition in which no domain formation occurs in either TELD (entry 1, Table 1). When the voltage at terminal S is decreased, the logic 1 is provided at terminal S delayed by the delay in element 30 plus delays inherent in the values the elements of circuit 8 following application of logic 1 to terminal X. When the domain is collected at the TELD 10 anode after a transit time period, the current in TELD 10 returns to threshold value and the voltage across each TELD becomes substantially the same as before the input logic signal. The voltage at terminal S then returns to logic 0 value. A logic 1 applied to terminal Y concurrently with a logic 0 applied to terminal X in accordance with entry 3, Table 1 operates identically to the operation just described in connection with entry 2.

In accordance with entry 4, table 1, when the logic 1 is concurrently applied to terminals X and Y having previously been at logic 0, domain formation occurs in TELD 12 thereby causing a decrease in TELD 12 current and thereby an increase in TELD 12 anode voltage. The increase in voltage at the anode of TELD 12 and therefore at the cathode of TELD 10 is such as to cause TELD 10 anode to cathode voltage to be so low as to inhibit domain formation therein so long as TELD 12 is forming domains. Therefore, after the time delay introduced by delay lines 30 and 40, when the voltage related to the logic 1 reaches the TELD 10 gates 1 and 2 no domain formation occurs in TELD 10. The increase in voltage at TELD 12 anode and thus at terminal S caused by domain formation in TELD 12 provides a logic 0* in accordance with the fourth entry of table 1. It should be understood that the logic 0* is a voltage more positive than the logic 0. This more positive voltage when applied to one or more other TELD circuits such as, for example, other exclusive-OR circuits is treated by the other circuits as is a logic 0. It should be appreciated that in the absence of delay lines 30 and 40, competition would occur between TELDs 10 and 12 as to which would form domains first, an unacceptable situation. After the domain is collected at TELD 12 anode, the current returns to nearly threshold value and the voltage at S returns to 0 logic value. If the logic 1 signals are again presented at terminals X and Y a new domain is formed. However, the transit time values of TELDs 10 and 12 must be properly chosen to prevent competition between the devices for certain particular input bit sequences as will be described now.

Figure 3:
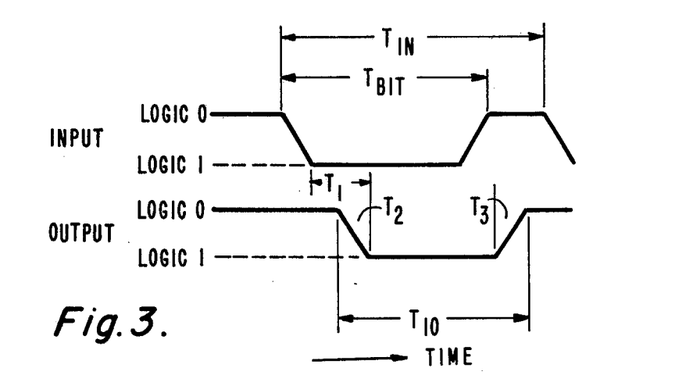
FIG. 3 is a representation of input and output waveforms of a typical TELD gate.

Attention is now directed to FIG. 3 which will be used to define time constants of the input and output voltage waveforms of the exclusive-OR circuit. The quantities are:

$T_{IN}$=input period,
$T_{BIT}$=data bit duration,
$T_1$=delay of logic gate,
$T_2$=output rise time, and
$T_3$=output fall time.

$T_{BIT}$ should be equal to $T_{IN}$ but satisfactory operation will occur if $T_{BIT}$ is slightly smaller than $T_{IN}$ but not equal to $T_{IN}/2$ or $T_{IN} \geq T_{BIT} > T_{IN}/2$. Since TELD devices are monostable and lead edge triggered, the timing of the beginning of $T_{BIT}$ is critical while the exact duration of $T_{BIT}$ is not critical.

Figure 4:
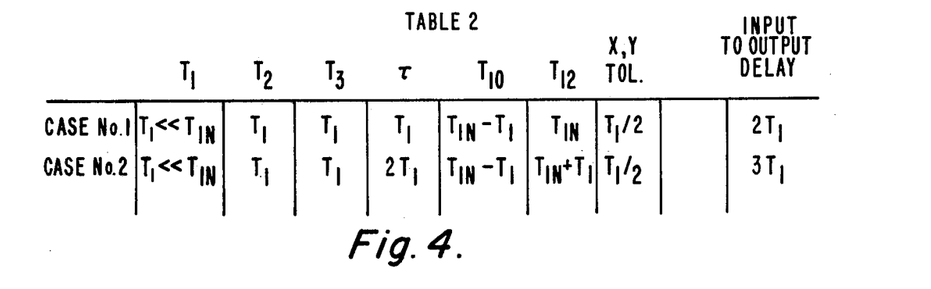
FIG. 4 is a table of parameters useful in understanding the timing of the circuit of FIG. 1.

FIG. 4, Table 2, contains parameters for two exclusive-OR circuit design cases. Waveforms for these two cases are shown in FIGS. 5 and 6.

In case no. 1 of Table 2, parameters of TELDs 10 and 12 are such that $T_{IN}$ is substantially equal to $T_{12}$ and $T_{10}$ is equal to $T_{IN}-T_1$. $\tau$ is substantially equal to $T_1$ and the values of $T_2$ and $T_3$ are assumed to be substantially equal to $T_1$ which is known to be much smaller than $T_{10}$.

Figure 5:
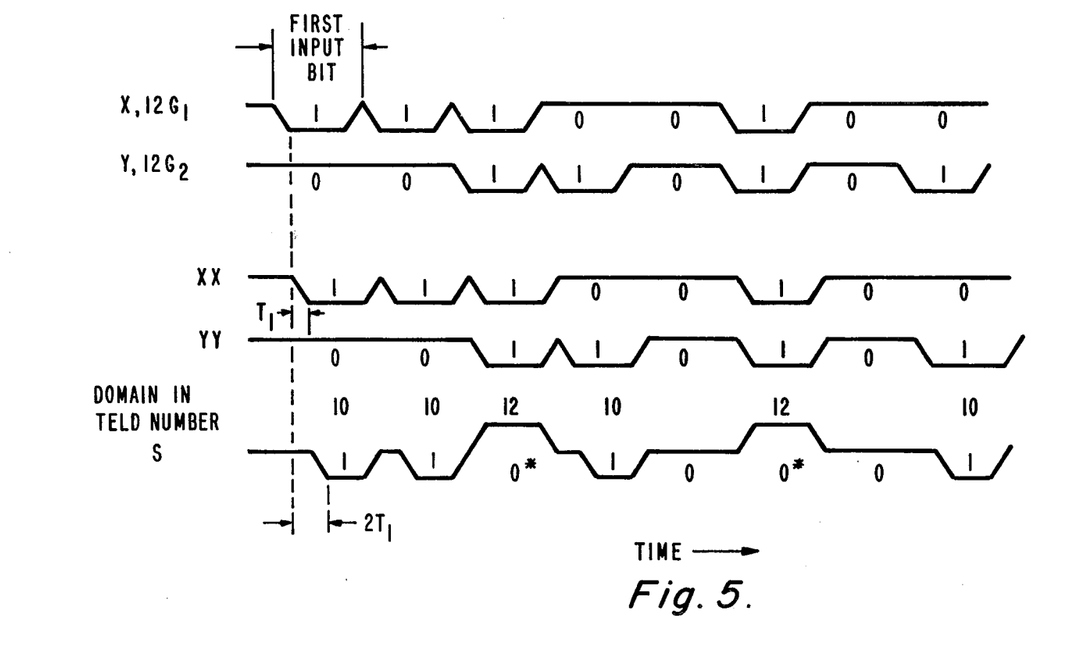
FIGS. 5 and 6 are sets of waveforms useful in understanding the operation of the circuit of FIG. 1.

FIG. 5 depicts a set of input bit data patterns assumed to be applied to input terminals X and Y. The resulting waveforms at terminals XX and YY are also shown and are delayed replicas of the applied signal patterns. Note that the first bit at XX is delayed $T_1$ from the first bit at X. The first logic 1 bit at XX causes domain formation in TELD 10 as described previously and causes the output S=logic 1 at time $2T_1$. The second bit pair (X=1, Y=0) produces the same output (S=1). Note however, that the third input bit pattern is X=1, Y=1. The output S=0* occurs at delay $T_1$ from the input because TELD 12 is triggered into domain formation. Because the S=0* output occurs with less delay then the S=1 output, the S=1 output bit duration is made shorter than $T_{IN}$ by time $T_1$. This is accomplished by making $T_{10}=T_{IN}-T_1$. If this were not the case, there would be competition between TELDs 10 and 12 at the end of the output S=1 bit. The remainder of the input-output bit patterns proceed just as described previously and produce the desired exclusive-OR output. Note that the meaningful output (i.e., S=1) is always delayed $2T_1$ from the input and no timing problems occur. It can be shown that the time synchronization of X and Y input bit patterns must be better than $\pm T_1/2$ for proper operation to occur.

Figure 6:
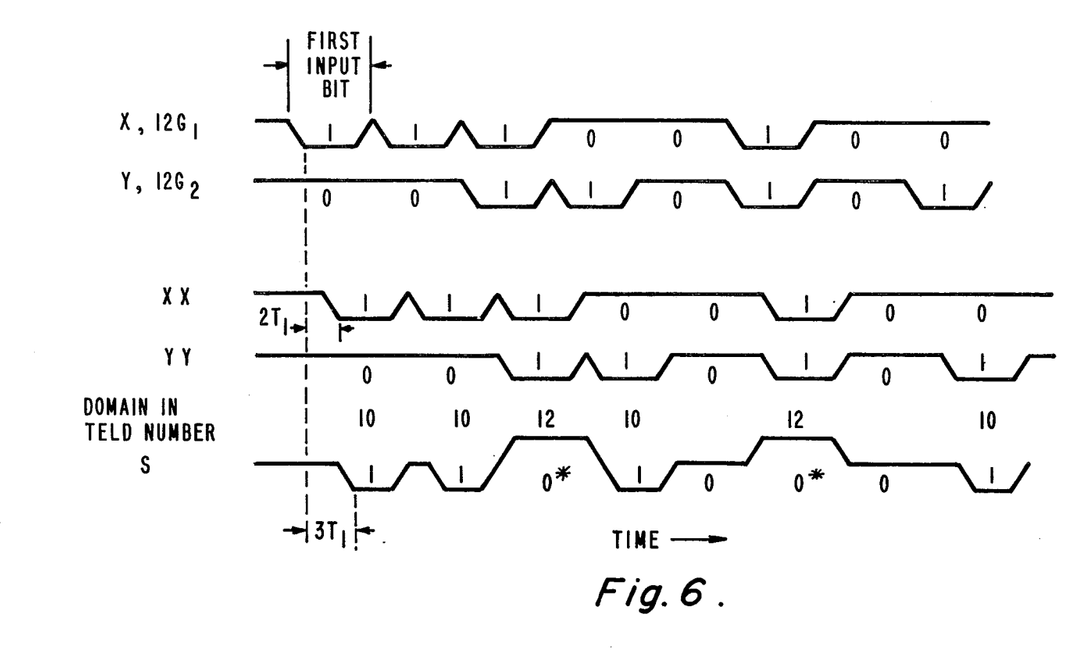

In case no. 2 of Table 2, FIG. 4, and with waveforms shown in FIG. 6, $\tau$ is chosen equal to $2T_1$. This enables a more conservative design since there will be less influence of small differences in the rise times and output delays of TELD 10 and 12 upon circuit performance. However, the input-output circuit delay will be increased which reduces the highest frequency of operation. In addition, $T_{12}$ must now be made substantially equal to $T_{IN}+T_1$ for proper operation, as will be shown.

FIG. 6 illustrates assumed input bit patterns applied to terminals X and Y and the resulting bit patterns at terminals XX and YY. For the first bit pair: X=1, Y=0. The XX=1 bit is delayed $2T_1$ and the output S=1 bit is delayed $3T_1$. The second bit pair produces the same output. The third bit pair is X=1, Y=1 and this causes output S=0* of delay $3T_1$, because no domain will form in TELD 12 until the domain in TELD 10 has been collected at the end of its transit time period.

The fourth and fifth input bit pairs produce the desired output as described earlier. The sixth input bit pair is X=1, Y=1 and this causes S=0* output at a delay time of $T_1$. If $T_{12}$ were not $T_{IN}+T_1$, then the 0* output would end while XX and YY bits are logic "1" and a false S=1 output bit would occur. However, with the transit time relationship described, the desired exclusive-OR output is obtained at terminal S. The useful output (S=1) is always delayed $3T_1$ from the input bit. Again the time synchronization of X and Y bit patterns must be better than $\pm T_1/2$ for proper operation to occur.

As shown in FIG. 7, exclusive-OR gate 8 and an AND gate 54 may be combined to form a one bit half adder 50. AND gate 54 is comprised of a third split gate TELD 42 having its cathode (C) connected to ground through a resistor 52 and to an output terminal $C_a$. The anode (A) of TELD 42 is connected to a source of potential, $V_3$. Gates $G_1$ and $G_2$ of TELD 42 are connected to terminals X and Y, respectively.

Figure 8:
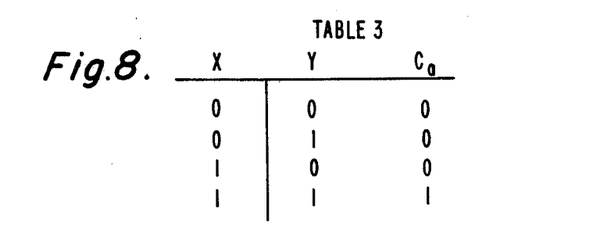
FIG. 8 is a table of input and output logic values associated with the circuit of FIG. 7.

Resistor 52 is selected to have a resistance substantially equal to twice the low-field resistance of TELD 42. The value of resistor 52 and the value of $V_3$ are chosen such that logic 1 concurrently applied to terminals X and Y causes domain formation in TELD 42. In accordance with the explanation given hereinbefore, the output of AND gate 50 is in accordance with table 3, FIG. 8. Signals provided at terminals S and $C_a$ comprise the outputs of half adder 50.

The output delay of exclusive-OR gate 8 (FIG. 1) depends upon, $\tau$, the inherent device delay of TELD 10, and the rise time of the output signals at terminal S. Since the inherent device delay is due to the domain formation process, $\tau$ is chosen to be about the same value as the device delay, $T_1$, for the reasons stated earlier. Since the domain formation time is known to be between 10 and 30 picoseconds, the total exclusive-OR gate delay ($2T_1$) can be made well under 100 picoseconds.

In the half adder circuit 50 of FIG. 7, with $\tau=T_1$, the sum signal S is produced with a delay of $2T_1$ while the carry signal $C_a$ is produced with a delay $T_1$. It, therefore, may be desirable to add a delay $T_1$ to the AND gate 54 to equalize the time delay for outputs S and C. The additional delay of $T_1$ can be obtained by adding two delay lines as for $\tau$, (30 and 40 of FIG. 1). A preferable method to obtain this additional delay is to connect the gates $G_1$ and $G_2$ of TELD 42 to terminals XX and YY, respectively of TELD 10. With this circuit the output bits at S and $C_a$ will both arrive at time $2T_1$ after the application of the input bits to X and Y.

It should be appreciated by anyone skilled in the art that the time delay $\tau$ produced by delay lines 30 and 40 may alternately be produced by an additional TELD gate arranged as a non-inverting buffer. The TELD buffer circuit is substantially the same as AND gate 54 with the same signal applied to both gates $G_1$ and $G_2$ or to a single gate which replaces gates $G_1$ and $G_2$. The delay of the buffer gate is substantially equal to $T_1$ or $\tau$. Using the buffer gates, the half adder circuit 50 consists of a minimum of five TELD devices and have an output delay of $2T_1$ for S and $C_a$.

In a two bit adder circuit, the $X_0$ and a bit $X_1$ are added to a bit $Y_0$ and a bit $Y_1$ to produce a two bit $S_0$ and $S_1$ and a carry bit $C_1$. A simple design of two bit adder would consist of three half adder circuits and one OR gate. However, it can easily be seen that the carry bit $C_1$ will be produced with delay $5T_1$ whereas $S_0$ and $S_1$ will be produced with delays of $2T_1$ and $4T_1$, respectively. Since it is usually desirable for all outputs to be produced at the same time, time delays should be added to the output lines $S_0$ and $S_1$.

In the same manner, a full adder circuit designed with TELD devices requires additional time delays placed appropriately for the output sum and carry bits to arrive at the same time. The minimum delay for a full adder of this design is $5T_1$.

It should also be appreciated by one skilled in the art that a reference clock may be used to provide time synchronization of signals in adder circuits using TELD devices. The signal in the TELD circuit is ANDED with the clock to produce an output synchronized with the clock. ANDING at several points in the TELD circuit would maintain synchronization which would otherwise be lost if an individual TELD gate had delay output the range of $T_1 \pm T_{\frac{1}{4}}$. However, each clock AND gate will add an additional delay of $T_1$ to the output signal. The input bit patterns such as shown as X and Y in FIGS. 5 and 6 can be obtained from other TELDs having transit time frequency substantially equal to $T_{IN}$. Starting with slowly varying input voltages to the Schottky-barrier gate of a TELD, the cathode load resistor output would be a bit pattern of bit period equal to the TELDs transit time frequency, equal to $T_{IN}$.

In one embodiment the various circuit elements of exclusive-OR gate 8 are as follows:
resistors 24 and 34=500 ohms
resistors 26 and 36=1318 ohms
resistors 28 and 38=862 ohms
resistor 22=200 ohms
delay lines 30 and 40 introduce a time delay of 30 picoseconds
$V_1$=22.5 volts
$V_2$=17.2 volts TELDs 10 and 12 are planar devices and are constructed with 17 $\mu$m anode-gate separation, with $n \times 1 \geq 10^{12}/cm^2$ and $nd \geq 10^{12}/cm^2$, where n is the donor density in the epitaxial layer, l is the anode-cathode separation and d is the epitaxial layer thickness. A choice of $n=2.5\times10^{15}/cm^3$, $l=20$ $\mu$m and $d=2$ $\mu$m produces a decrease of 25 percent in current through GaAs devices with low defect density, low trap density and a large low-field electron mobility. A device width of 80 $\mu$m is used. TELDs 10 and 12 required a gate voltage of 1.7 V below cathode voltage to cause domain formation at either segment of gates $G_1$ or $G_2$ (with the other gate at cathode voltage) of TELDs 10 and 12. However, a gate voltage of 1.1 V below cathode voltage applied to both gates $G_1$ and $G_2$ of TELDs 10 and 12 also cause domain formation. Accordingly, logic 1 is in a range from 11.1 volts to 9.6 volts with respect to ground to produce between $-1.1$ and $-1.7$ volts with respect to TELD 12 cathode. This logic 0 voltage of reduced amplitude is in a range of above 14 volts to 11.1 volts with respect to the ground to produce less than $-1.1$ volts with respect to TELD 12 cathode.

What is claimed is:
1. A circuit having first and second input terminals, each adapted to receive a stream of logic 1 signals and logic 0 signals, comprising:
a first transferred electron logic device (TELD), having first and second Schottky-barrier gates equidistant from the anode thereof, said anode adapted to connection to a positive terminal of a bias voltage source;

a second TELD having first and second Schottky-barrier gates equidistant from the anode thereof, said anode thereof being connected at an output junction to the cathode of said first device, the cathode of said second device being adapted to connection to the negative terminal of said bias voltage source;

delay means connected to said input terminals for respectively coupling said signals from said first and second input terminals to said gates of said first device, said first device forming a domain in response to one of said signals being a logic 1, thereby causing a logic 1 signal to be provided at said output junction; and divider means connected to said input terminals and said gates of said second device for respectively coupling a fraction of said input signals from said first and second input terminals to said gates of said second device, said second device forming a domain in response to both of said second signals being a logic 1, whereby a signal representative of a logic 0 is provided at said output junction.

2. The combination as set forth in claim 1 further including a power source for providing an anode-cathode bias power to each TELD of value such that when the input signal to said first and second input terminals are at said logic 0 signal, said TELDs do not have domain formation.

3. The combination as set forth in claim 2 wherein said divider means includes means to provide input signals to said second TELD first and second gate terminals of such magnitude that said second TELD is driven to domain formation only when both input signals are at said logic 1.

4. The combination as set forth in claim 1 further including a third TELD arranged as a logic AND circuit including anode and cathode terminals adapted to receive a bias voltage therebetween, first and second gate terminals connected to said input terminals, respectively and a second output terminal coupled to said cathode terminals of said third TELD at which is produced a signal which is a logic AND of the input signals, the combination of said AND circuit and said exclusive-OR circuit comprising a half adder circuit.

* * * * *

UNITED STATES PATENT AND TRADEMARK OFFICE
CERTIFICATE OF CORRECTION

PATENT NO. : 4,160,919

DATED : July 10, 1979

INVENTOR(S) : Walter R. Curtice

It is certified that error appears in the above-identified patent and that said Letters Patent is hereby corrected as shown below:

Column 8, line 41 "nX1" should be --nXℓ--;

Column 8, line 43 "1" should be --ℓ--;

Column 8, line 45 "1" should be --ℓ--;

Column 9, line 1 "adapted to" should be --adapted for--;

Column 9, line 8 "adapted to" should be --adapted for--

Signed and Sealed this

Ninth Day of October 1979

[SEAL]

Attest:

RUTH C. MASON
Attesting Officer

LUTRELLE F. PARKER
Acting Commissioner of Patents and Trademarks